United States Patent
Kim

(10) Patent No.: US 7,531,827 B2
(45) Date of Patent: May 12, 2009

(54) GALLIUM NITRIDE-BASED LIGHT EMITTING DIODE AND FABRICATION METHOD THEREOF

(75) Inventor: Seong Jae Kim, Gwangju-si (KR)

(73) Assignee: LG Innotek Co., Ltd., Seoul (KR)

(*) Notice: Subject to any disclaimer, the term of this patent is extended or adjusted under 35 U.S.C. 154(b) by 111 days.

(21) Appl. No.: 11/333,247

(22) Filed: Jan. 18, 2006

(65) Prior Publication Data

US 2006/0113550 A1   Jun. 1, 2006

Related U.S. Application Data

(63) Continuation of application No. PCT/KR2004/001687, filed on Jul. 9, 2004.

(30) Foreign Application Priority Data

Jul. 18, 2003   (KR) .................. 10-2003-0048993

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/732 | (2006.01) |
| H01L 29/739 | (2006.01) |

(52) U.S. Cl. .............. 257/13; 257/12; 257/14; 257/15; 257/22; 257/183; 257/190; 257/200; 257/E25.028; 257/E25.032; 257/E33.028; 257/E33.031; 257/E33.033; 257/E33.034; 257/E33.049

(58) Field of Classification Search ............. 257/12–15, 257/22, 183, 189, 190, 200, E25.028, E25.032, 257/E33.028, E33.031, E33.033, E33.034, 257/E33.049

See application file for complete search history.

(56) References Cited

U.S. PATENT DOCUMENTS

| | | | | |
|---|---|---|---|---|
| 5,684,309 | A * | 11/1997 | McIntosh et al. | 257/191 |
| 5,779,924 | A * | 7/1998 | Krames et al. | 216/24 |
| 6,028,877 | A * | 2/2000 | Kimura | 372/46.01 |
| 6,153,894 | A * | 11/2000 | Udagawa | 257/96 |

(Continued)

FOREIGN PATENT DOCUMENTS

JP        10-303458 A      11/1998

(Continued)

*Primary Examiner*—Ida M Soward
(74) *Attorney, Agent, or Firm*—Birch, Stewart, Kolasch & Birch, LLP

(57) ABSTRACT

A light emitting diode (LED) and a method for fabricating the same, capable of improving brightness by forming a InGaN layer having a low concentration of indium, and whose lattice constant is similar to that of an active layer of the LED, is provided. The LED includes: a buffer layer disposed on a sapphire substrate; a GaN layer disposed on the buffer layer; a doped GaN layer disposed on the GaN layer; a GaN layer having indium disposed on the GaN layer; an active layer disposed on the GaN layer having indium; and a P-type GaN disposed on the active layer. Here, an empirical formula of the GaN layer having indium is given by $In(x)Ga(1-x)N$ and a range of x is given by $0<x<2$, and a thickness of the GaN layer having indium is 50-200 Å.

16 Claims, 3 Drawing Sheets

U.S. PATENT DOCUMENTS

| | | | | |
|---|---|---|---|---|
| 6,226,355 B1 * | 5/2001 | Prins | | 378/158 |
| 6,285,696 B1 * | 9/2001 | Bour et al. | | 372/45.01 |
| 6,345,063 B1 * | 2/2002 | Bour et al. | | 372/45.01 |
| 6,509,579 B2 * | 1/2003 | Takeya et al. | | 257/22 |
| 6,555,846 B1 * | 4/2003 | Watanabe et al. | | 257/94 |
| 6,667,498 B2 * | 12/2003 | Makimoto et al. | | 257/183 |
| 6,677,619 B1 * | 1/2004 | Nagahama et al. | | 257/94 |
| 6,756,245 B2 * | 6/2004 | Ohbo et al. | | 438/46 |
| 6,838,703 B2 * | 1/2005 | Yamaguchi et al. | | 257/94 |
| 6,977,953 B2 * | 12/2005 | Hata et al. | | 372/46.01 |
| 2002/0110945 A1 * | 8/2002 | KURAMATA et al. | | 438/36 |
| 2002/0139984 A1 * | 10/2002 | Sugawara et al. | | 257/79 |
| 2003/0216011 A1 * | 11/2003 | Nakamura et al. | | 438/478 |
| 2004/0004223 A1 * | 1/2004 | Nagahama et al. | | 257/74 |
| 2004/0051108 A1 * | 3/2004 | Nortrup | | 257/82 |
| 2004/0155248 A1 * | 8/2004 | Fukuda et al. | | 257/79 |
| 2004/0164308 A1 * | 8/2004 | Asatsuma et al. | | 257/94 |
| 2004/0201030 A1 * | 10/2004 | Kryliouk et al. | | 257/103 |
| 2004/0251471 A1 * | 12/2004 | Dwilinski et al. | | 257/103 |

FOREIGN PATENT DOCUMENTS

| | | |
|---|---|---|
| JP | 2000-261105 A | 9/2000 |
| JP | 2001-7444 A | 1/2001 |
| JP | 2002-359438 A | 12/2002 |

* cited by examiner

GALLIUM NITRIDE-BASED LIGHT EMITTING DIODE AND FABRICATION METHOD THEREOF

This application is a Continuation of copending PCT International Application No. PCT/KR2004/001687 filed on Jul. 9, 2004, which designated the United States, and on which priority is claimed under 35 U.S.C. § 120. This application also claims priority under 35 U.S.C. § 119(a) on Patent Application No(s). 10-2003-0048993 filed in Korea, Republic of on Jul. 18, 2003. The entire contents of each of the above documents is hereby incorporated by reference.

TECHNICAL FIELD

The present invention relates to a light emitting diode, and more particularly, to a light emitting diode and a fabrication method thereof in which a light efficiency can be improved by forming a layer containing indium (In), whose lattice constant is similar to that of an active layer formed in the LED.

BACKGROUND ART

Generally, a light emitting diode (LED) is a kind of semiconductor device, and it converts an electrical signal into infrared ray or light by using a characteristic of a compound semiconductor, to send or receive a signal. The LED is used for home appliances, a remote controller, an electronic display board, a display device, a variety of automation apparatuses and the like.

An operation principle of the LED will be briefly described in the following.

When a forward voltage is applied to a semiconductor of a specific chemical element, electrons and holes are recombined with each other while moving through a positive-negative junction. The recombination of the electrons and the holes causes an energy level to fall down, so that light is emitted.

The LED is generally manufactured to have a very small size of 0.25 mm$^2$ and is mounted on a printed circuit board (PCB) or a lead frame using an epoxy mold.

Representative of the LEDs is a plastic package of 5 mm (T 1¾) or a new package being developed in a specific application field.

A color of light emitted from the LED is determined by a wavelength obtained depending on a combination of elements constituting a semiconductor chip.

Particularly, as an information communication apparatus is in a trend of a small-size and slimness, the communication apparatus has more miniaturized parts such as a resistance, a condenser, and a noise filter. The LED is manufactured in a form of a surface mounted device (hereinafter, referred to as "SMD") so as to be directly mounted on a printed circuit board (hereinafter, referred to as "PCB").

Accordingly, an LED lamp for a display device is being developed in the form of the SMD. Such an SMD can substitute a related-art simple lamp. The SMD is used for a lamp display, a character display, an image display and the like that express various colors.

Further, as a high-density integration technology for a semiconductor device is developed and a consumer prefers a more compact electronic product, Semiconductor Mounting Technology (SMT) is widely used, and a packaging technology of the semiconductor device employs a technology for minimizing an installation space such as a Ball Grid Array (BGA), a wire bonding, and a flip chip bonding.

FIG. 1 is a view illustrating a process for fabricating a light emitting diode according to the related art.

As shown in FIG. 1, a gallium nitride (GaN) buffer layer 101 is formed on a sapphire substrate 100 formed of $Al_2O_3$. After that, a GaN layer 103, which is not doped with dopants (Hereinafter, referred to as "undoped"), is formed on the GaN buffer layer 101.

In order to form a Group 3-based element in a form of a thin film on the sapphire substrate 100 as described above, a metal organic chemical vapor deposition (MOCVD) is generally used. At this time, the thin film layer is formed under a constant growth pressure.

An N-type GaN layer 105 is formed on the undoped GaN layer 103, and silicon using silane ($SiH_4$) or disilane ($Si_2H_6$) gases is used to form the N-type GaN layer 105.

After the N-type GaN layer 105 is formed, an active layer 109 is formed on the N-type GaN layer 105. The active layer 109 functioning as a light emission region is a semiconductor layer having an illuminant formed of a indium gallium nitride (InGaN).

After the active layer 109 is formed, a P-type GaN layer 110 is subsequently formed.

The P-type GaN layer 110 is in a contrast to the N-type GaN layer 105. Namely, electrons are drifted by an external voltage in the N-type GaN layer 105, while holes are drifted by the external voltage in the P-type GaN layer 110. Therefore, the holes and the electrons are mutually recombined in the active layer 109, thereby emitting light.

A transparent metal(TM) layer using a transparent Indium-Tin-Oxide (ITO) metal is formed on the P-type GaN layer 110 so that light generated at the active layer 109 is transmitted and emitted to the external.

After the TM layer is formed, a P-type electrode is formed to complete the LED.

However, the LED constructed as above has a drawback in that a strain is increased due to an inconsistency of the lattice constants between the InGaN layer of the active layer and the GaN layer, thereby reducing an amount of light generated in the active layer.

Further, the inconsistency of the lattice constant deteriorates a product reliability of the LED.

Also, there is a drawback in that the active layer, which is formed on the N-type GaN layer adjacent to the active layer in a form of a two-dimensional plane, has a lower luminous intensity than a three-dimensional formation.

DISCLOSURE OF THE INVENTION

Accordingly, the present invention is directed to an LED and a fabrication method thereof that substantially obviate one or more problems due to limitations and disadvantages of the related art.

An object of the present invention is to provide an LED and a fabrication method thereof in which a GaN layer having a low concentration of indium (In) is formed between the active layer and an N-type GaN layer to reduce an inconsistency of lattice constants between an active layer and a GaN layer, thereby increasing a light efficiency and improving a product reliability.

To achieve these and other advantages and in accordance with the purpose of the present invention, as embodied and broadly described, a light emitting diode includes: a buffer layer disposed on a sapphire substrate; a GaN layer disposed on the buffer layer; an N-type GaN layer disposed on the GaN layer; a GaN layer having indium disposed on the N-type GaN layer; an active layer disposed on the GaN layer having indium; and a P-type GaN layer disposed on the active layer.

Here, an empirical formula of the GaN layer having indium is given by In(x)Ga(1-x)N and a range of x is given by 0<x<2, and a thickness of the GaN layer having indium is 50-200 Å.

Also, a GaN layer whose thickness is 10-30 Å is formed on the GaN layer having indium, and the active layer is of a multi-quantum well structure having a InGaN/GaN structure.

Also, a method for fabricating a LED according to the present invention, includes the steps of: forming a buffer layer on a sapphire substrate; forming a GaN layer on the buffer layer; forming an N-type GaN layer on the GaN layer; forming a GaN layer having indium on the N-type GaN layer; forming an active layer on the GaN layer having indium; and forming a P-type GaN layer on the active layer.

Here, after the GaN layer having indium is formed, a GaN layer is subsequently formed at a thickness of 10-30 Å, and the active layer is formed in 1 period to 7 periods under a temperature condition of 600-800° C.

Also, after the active layer is formed, the P-type GaN layer is formed at a thickness of 750-1500 Å at a temperature of 980-1020° C.

According to the present invention, the InGaN layer having a low concentration of indium is formed between the N-type GaN layer and the active layer formed on the sapphire substrate, so that deterioration of light efficiency due to inconsistency of a lattice constant between the GaN layer and the active layer is prevented and the light efficiency can be improved.

Also, the InGaN layer having a low Indium composition has a three dimensional structure on its surface and such three-dimensional growth of the surface can improve the light efficiency even more.

BEST MODE FOR CARRYING OUT THE INVENTION

Hereinafter, preferred embodiments of the present invention will be described in detail with reference to accompanying drawings.

FIGS. 2a through 2d are views illustrating a process for fabricating a light emitting diode (LED) according to the present invention.

Figure 1:
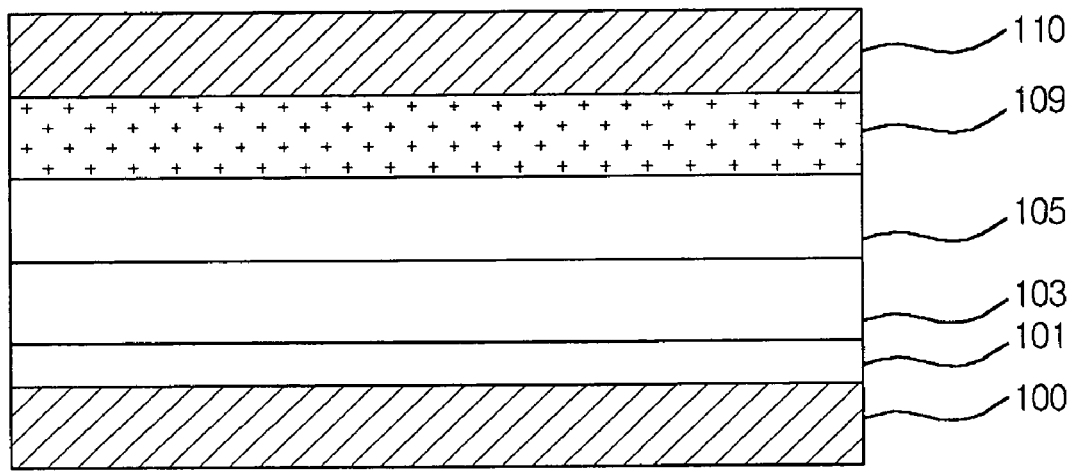
FIG. 1 is a view illustrating a process for fabricating an LED according to the related art.
Figure 2A:
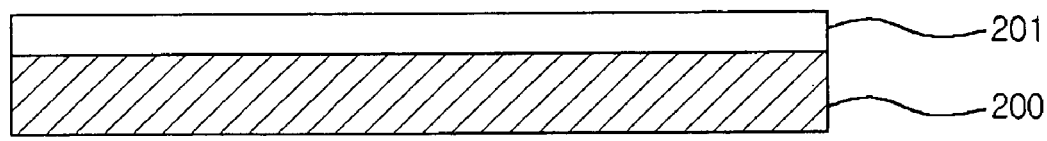
FIGS. 2a through 2d are views illustrating a process for fabricating an LED according to the present invention.

As shown in FIGS. 2a through 2d, a buffer layer 201 having an empirical formula of In(x)Ga(1-x)N is formed on a sapphire ($Al_2O_3$) substrate 200 at a temperature of 500-600° C., and an undoped GaN layer 203 is grown up to a thickness of 1-3 μm on the buffer layer 201 at a temperature of 1000-1100° C. (FIG. 2a).

Figure 2B:
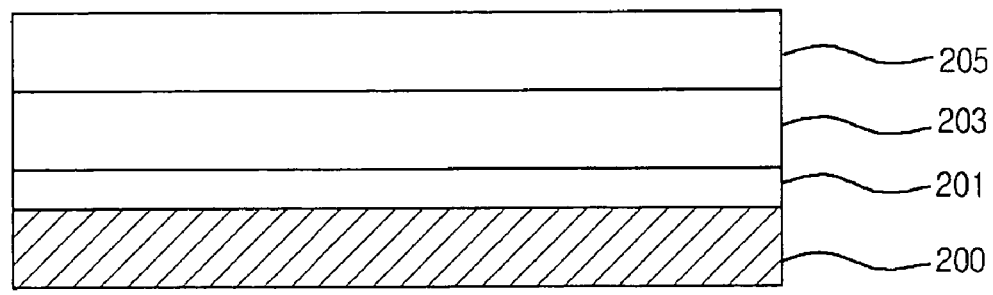

Next, an N-type GaN layer 205 is grown up to a thickness of 1-3 μm on the undoped GaN layer 203 at a temperature of 1000-1100° C. (FIG. 2b).

Figure 2C:
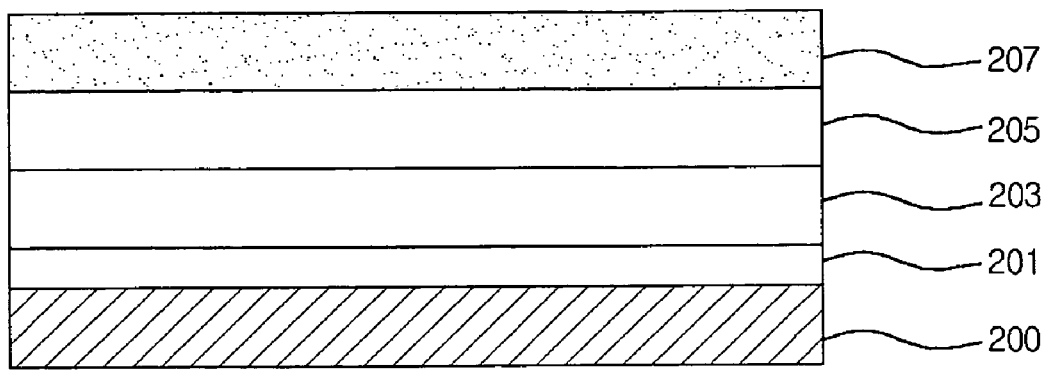
Figure 2D:
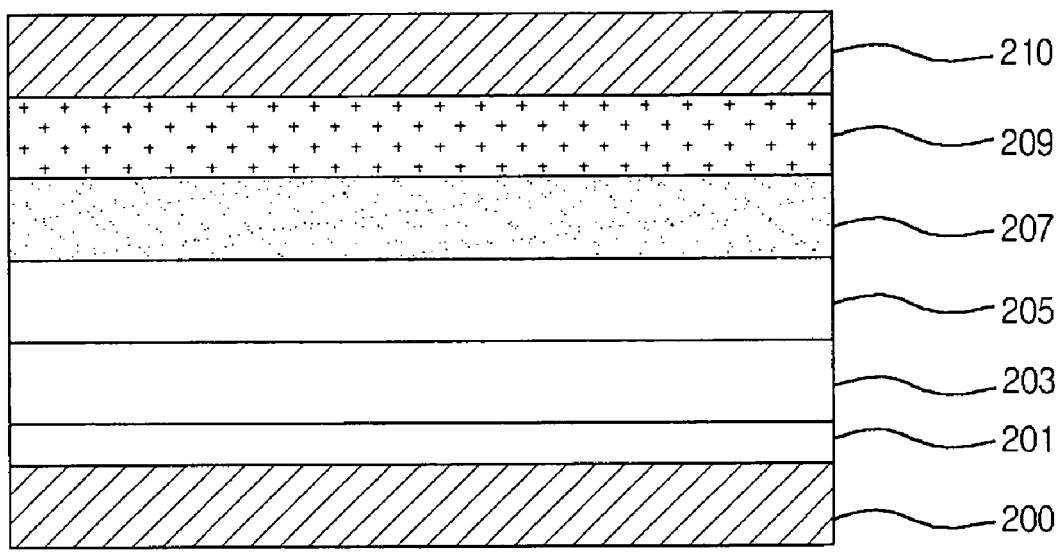

After the N-type GaN layer 205 is formed, a GaN layer 207 having a low mole of indium (In) is grown up at a temperature of 600-800° C. before an active layer 209 is formed (FIG. 2c).

The composition ratio of indium in the InGaN layer 207 is given by In(x)Ga(1-x)N(0<x<0.2). The In(x)Ga(1-x)N (0<x<0.2) layer is grown up to a thickness of 50-200 Å.

After the InGaN layer 207 is formed, an active layer 209 is formed.

The active layer 209 is formed of GaN layer at a thickness of 10-30 Å and makes an electron tunnels into a quantum-well layer, thereby preventing holes from penetrating into the In(x)Ga(1-x)N(0<x<0.2) layer.

The active layer 209 of the InGaN/GaN having a multi-quantum-well structure is formed in 1 period to 7 periods at a temperature of 600-800° C.

After the active layer 209 is formed, a P-type GaN layer 210 doped with a dopant of magnesium (Mg) is formed grown up to a thickness of 750-1500 Å at a temperature of 980-1020° C.

Figure 3:
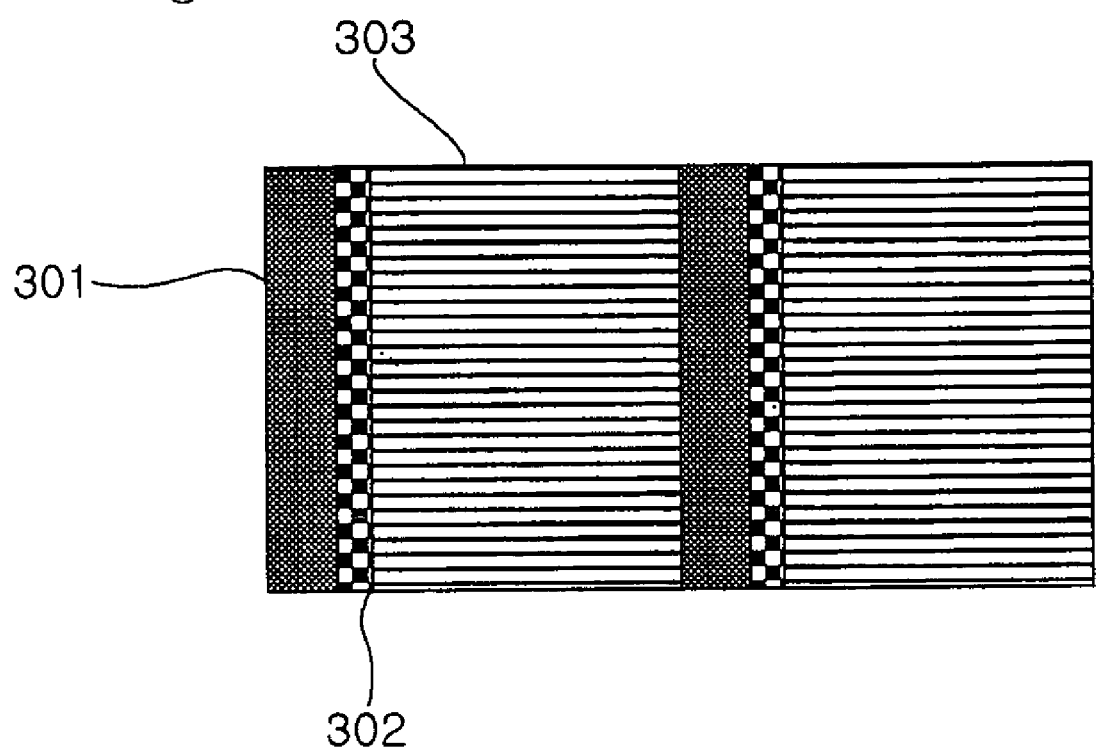
FIG. 3 is a view schematically showing a P-type GaN layer formed according to a quantum well growing method among the method for fabricating the LED according to the present invention.

FIG. 3 is a view schematically showing a P-type GaN layer formed according to a quantum-well growing method among the method for fabricating the LED according to the present invention.

As shown in FIG. 3, in the quantum-well growing method, a well growing step of forming a well layer 301 that includes various dopants such as In, Ga, and N is performed. Here, a growth condition of the well layer 301 is given by TMGa: 0-200 μmol/min, TMIn: 0-100 μmol/min, $NH_3$: 0-80 L/min, growing temperature: 600-800° C.

Subsequently, an enough crystal time is given so that the dopants included in the step of growing the well layer 301 may combine each other completely to form a crystal layer 302, whereby a combining ability of In and N, Ga and N, In and Ga inside the well layer 301, is improved.

Here, a growth time of the crystal layer 302 is given by 0.1 sec-60 min and $N_2$: 30-50 L/min, $H_2$: 30-50 L/min.

Next, a barrier growing step of forming a barrier layer 303 including various dopants such as Ga, N, is performed. Here, a growth condition of the barrier layer 303 is given by TMGa: 100-500 μmol/min, TMIn: 50-200 μmol/min, $NH_3$: 0-80 L/min, growing temperature: 600-800° C.

As described above, the active layer 209 is formed so as to have a multi-quantum well structure in the present invention, and the GaN layer 207 having the low concentration of indium is formed in a shallow thickness on the N-type GaN layer 205 at a low temperature, so that inconsistency of the lattice constant with the active layer 209 is reduced and light efficiency can be improved.

Also, since the InGaN layer of the active layer 209 is formed through a three-dimensional growth, a brightness of light generated at the active layer 209 is increased.

INDUSTRIAL APPLICABILITY

As described above in detail, the present invention forms the InGaN layer having a low concentration of indium between the N-type GaN layer and the active layer formed on the sapphire substrate, thereby reducing inconsistency of the lattice constant with the active layer and improving light efficiency.

Further, the InGaN layer having the low concentration of indium, has a three dimensional structure on its surface, and light efficiency can be improved even more in case a surface has such a three-dimensional structure.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. An LED comprising:
a buffer layer disposed above a substrate;
at least one N-type GaN layer disposed above the buffer layer;
a GaN layer having indium disposed above the N-type GaN layer;
an active layer disposed above the GaN layer having indium; and
at least one P-type GaN layer disposed above the active layer,
wherein a thickness of the GaN layer having indium is 50-200 Å,
wherein the active layer includes a well layer, a crystal layer and a barrier layer, and
wherein the crystal layer is formed between the well layer and the barrier layer.

2. The LED according to claim 1, wherein the active layer has a three dimensional structure.

3. The LED according to claim 1, further comprising an undoped GaN layer disposed between the buffer layer and the N-type GaN layer.

4. The LED according to claim 1, wherein the GaN layer having indium has a low mole of indium.

5. The LED according to claim 1, wherein an empirical formula of the GaN layer having indium is given by $In(x)Ga(1-x)N$ and a range of x is given by $0<x<0.2$.

6. The LED according to claim 1, wherein a GaN layer whose thickness is 10-30 Å, is formed above the GaN layer having indium.

7. The LED according to claim 6, wherein the active layer directly formed on the GaN layer.

8. The LED according to claim 1, wherein the active layer is of a multi-quantum well structure having an InGaN/GaN structure.

9. An LED comprising:
a first conductive type semiconductor layer;
a GaN layer having indium formed on the first conductive type semiconductor layer;
a GaN layer directly formed on the GaN layer having indium;
an active layer directly formed on the GaN layer; and
a second conductive type semiconductor layer disposed above the active layer,
wherein an empirical formula of the GaN layer having indium is given by $In(x)Ga(1-x)N$ and a range of x is given by $0<x<0.2$,
wherein a thickness of the GaN layer having indium is 50-200 Å,
wherein the active layer includes a well layer, a crystal layer and a barrier layer, and
wherein the crystal layer is formed between the well layer and the barrier layer.

10. The LED according to claim 9, comprising an undoped GaN layer disposed under the first conductive type semiconductor layer.

11. The LED according to claim 10, comprising a buffer layer disposed under the undoped GaN layer.

12. An LED comprising:
a first conductive type semiconductor layer;
a GaN layer having indium formed on the first conductive type semiconductor layer;
a GaN layer directly formed on the GaN layer having indium;
an active layer directly formed on the GaN layer; and
a second conductive type semiconductor layer disposed above the active layer.

13. The LED according to claim 12, wherein an empirical formula of the GaN layer having indium is given by $In(x)Ga(1-x)N$ and a range of x is given by $0<x<0.2$.

14. The LED according to claim 12, wherein a thickness of the GaN layer having indium is 50-200 Å.

15. The LED according to claim 12, a thickness of the GaN layer is 10-30 Å.

16. The LED according to claim 12, wherein the active layer includes a well layer, a crystal layer and a barrier layer.

* * * * *